United States Patent
Haden et al.

[11] Patent Number: 5,848,083
[45] Date of Patent: Dec. 8, 1998

[54] EXPANSION-MATCHED HIGH-THERMAL-CONDUCTIVITY STRESS-RELIEVED MOUNTING MODULES

[75] Inventors: James M. Haden, San Jose; Michael P. Staskus, Saratoga, both of Calif.

[73] Assignee: SDL, Inc., San Jose, Calif.

[21] Appl. No.: 736,252

[22] Filed: Oct. 24, 1996

[51] Int. Cl.⁶ .............................. H01S 3/04; H01L 23/495; B41J 29/38
[52] U.S. Cl. .............................. 372/36; 372/34; 372/43; 372/50; 372/108; 372/109; 257/675; 347/17; 347/18
[58] Field of Search ..................... 372/7, 26, 34, 372/35, 36, 43, 50, 108, 109; 359/109, 181; 257/675; 347/17, 18, 26, 61

[56] References Cited

U.S. PATENT DOCUMENTS

| | | | |
|---|---|---|---|
| 4,278,990 | 7/1981 | Fichot | 257/675 X |
| 4,383,270 | 5/1983 | Schelhorn | 257/675 X |
| 4,427,993 | 1/1984 | Fichot et al. | 257/675 X |
| 4,716,568 | 12/1987 | Scifres et al. | 372/36 |
| 5,099,488 | 3/1992 | Ahrabi et al. | 372/361 |
| 5,105,430 | 4/1992 | Mundinger et al. | 372/35 |
| 5,107,091 | 4/1992 | Wagner et al. | 219/121.84 |
| 5,291,371 | 3/1994 | Gruber et al. | 361/705 |
| 5,621,243 | 4/1997 | Baba et al. | 257/712 |
| 5,645,937 | 7/1997 | Noda et al. | 428/408 |

*Primary Examiner*—Brian Healy
*Attorney, Agent, or Firm*—W. Douglas Carothers, Jr.

[57] ABSTRACT

A mounting module (submount) for a high-power heat-dissipating element comprises a mounting plate thermal-expansion-matched to the element, a high-thermal-conductivity bulk layer having stress-relief apertures, and an auxiliary plate bonded to the bulk layer opposite the mounting plate. The element is mounted on the mounting plate, while the bulk layer is attached to the mounting plate on the side opposite the element. The apertures accommodate the expansion of the bulk layer along a major dimension of the mounting plate. The apertures run transverse to the mounting plate, so as not to impede heat flow through the mounting plate. The apertures serve either as reservoirs for excess solder during module assembly, or as conduits for cooling fluid. The bulk layer comprises either stacked sheets having aperture sections defined prior to assembly, or blocks defining the apertures at the block interfaces. Suitable heat-dissipating elements include high-power, high-duty cycle diode lasers and laser arrays, FETs, MOPAs, thyristors, and other high-power electronic components. For a GaAs laser bar, the mounting plate can be a thin CuW or Cu/Mo plate, while the bulk layer may be made of Cu. The stress-relief allows brazing the bulk layer and the mounting plate.

52 Claims, 8 Drawing Sheets

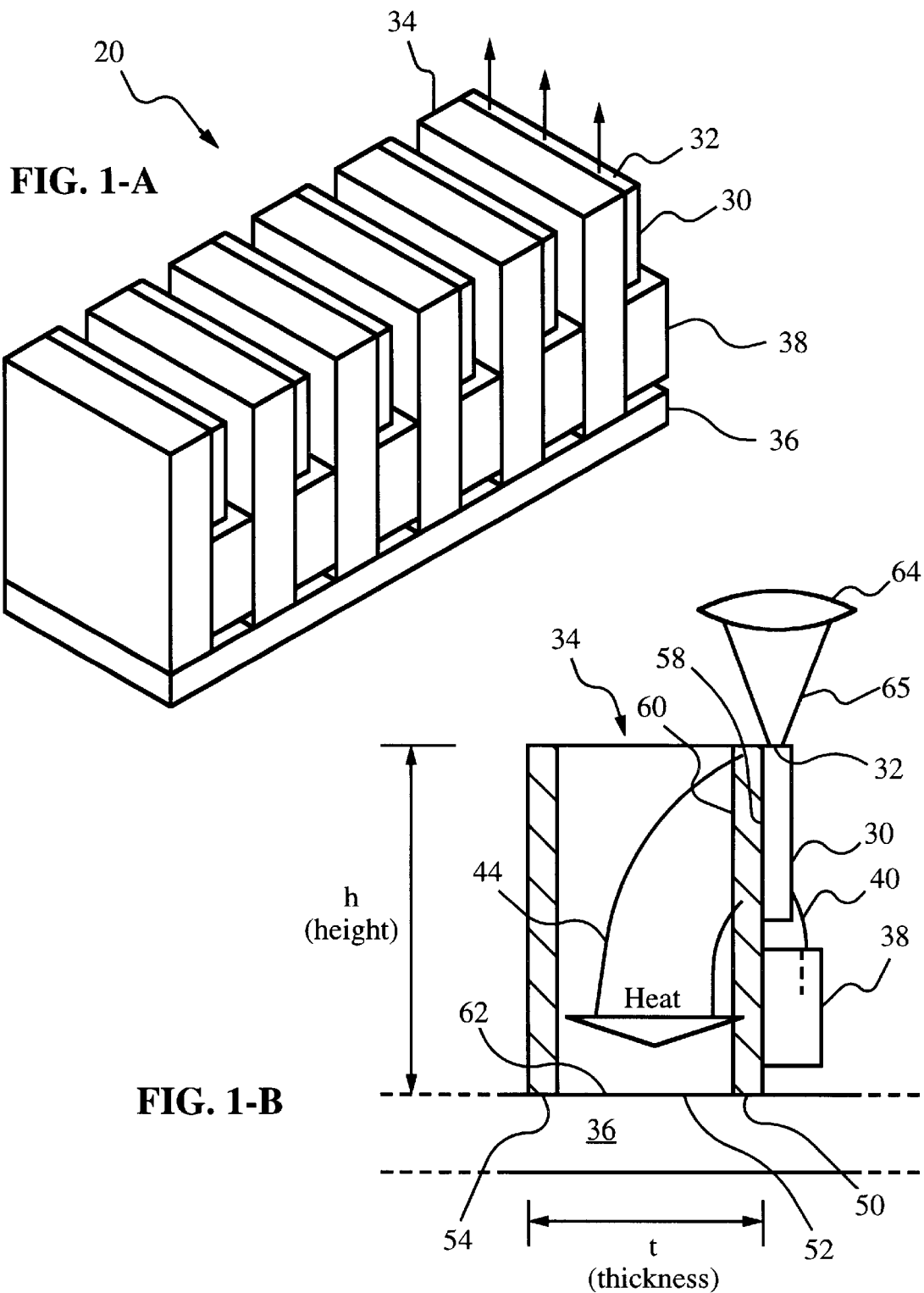
FIG. 1-A
FIG. 1-B

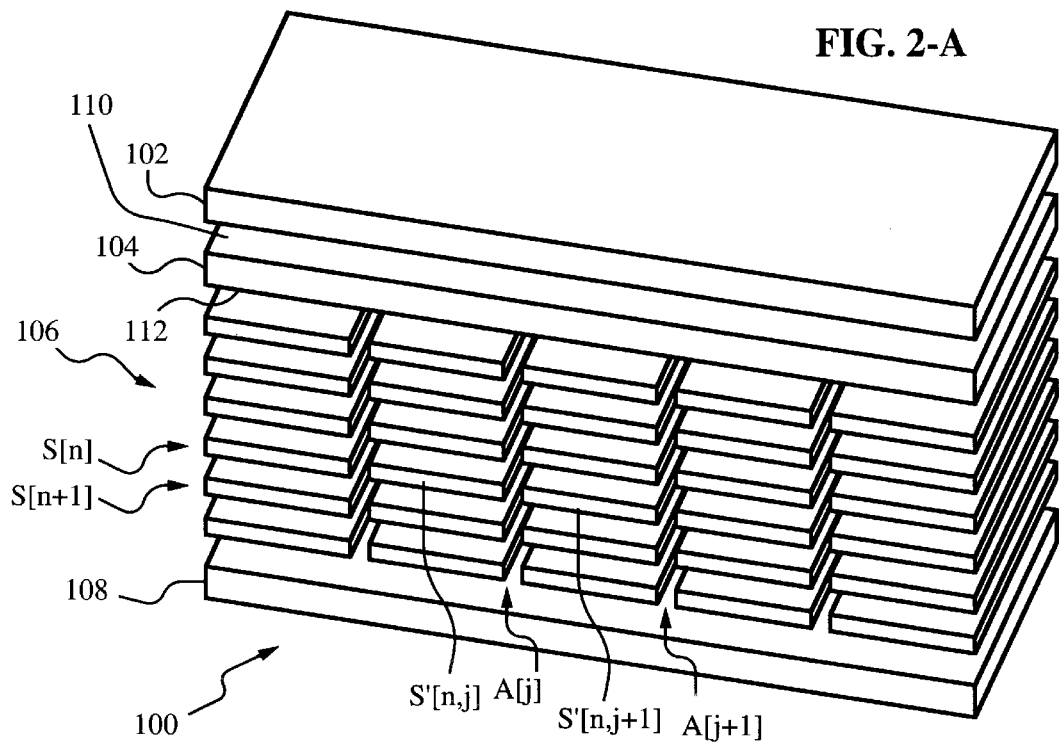
FIG. 2-A
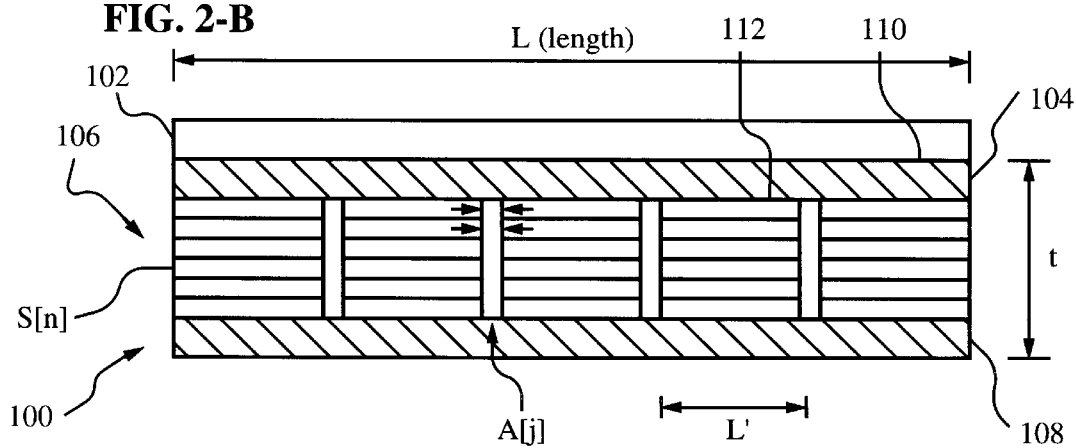
FIG. 2-B

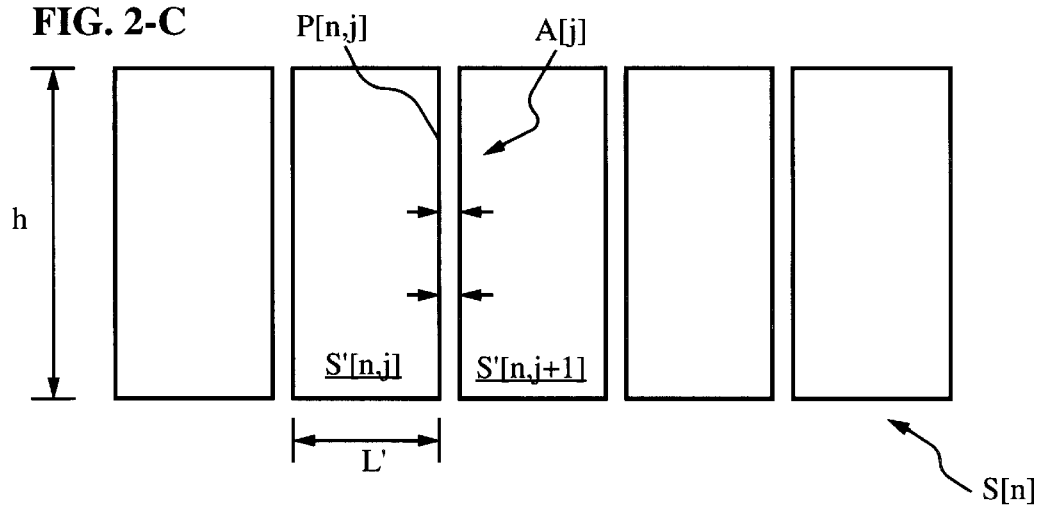
FIG. 2-C
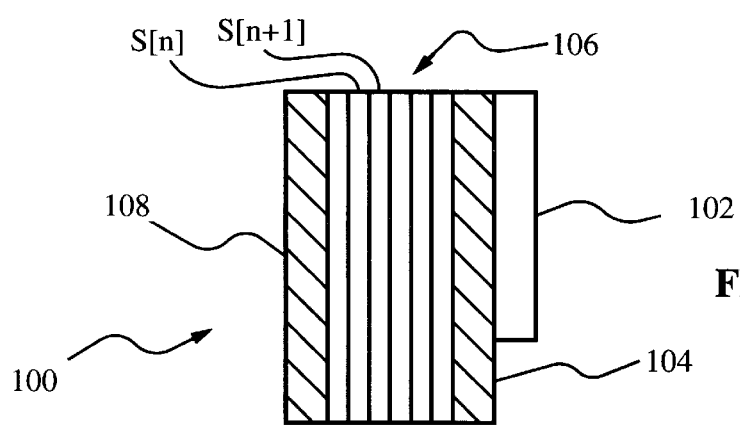
FIG. 2-D
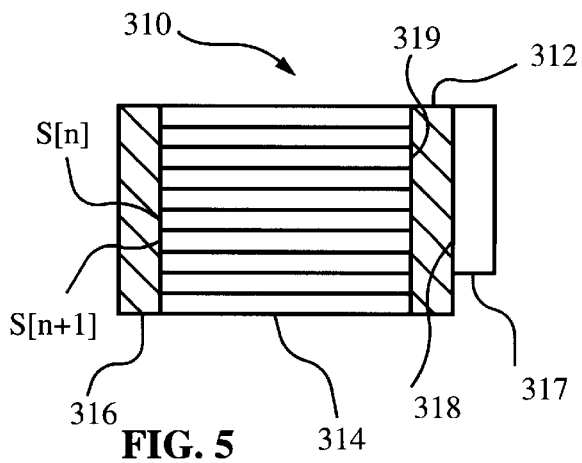
FIG. 5

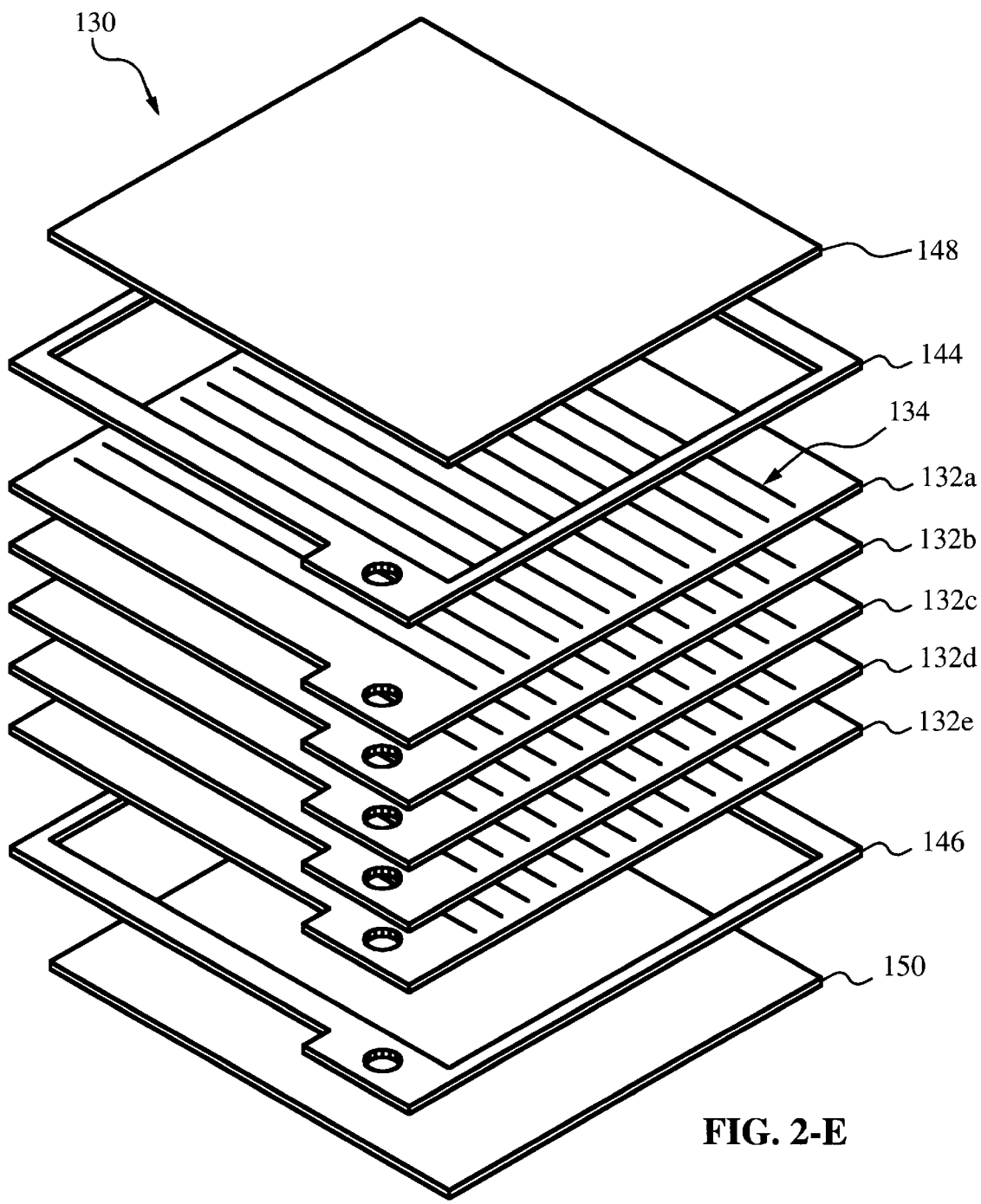
FIG. 2-E

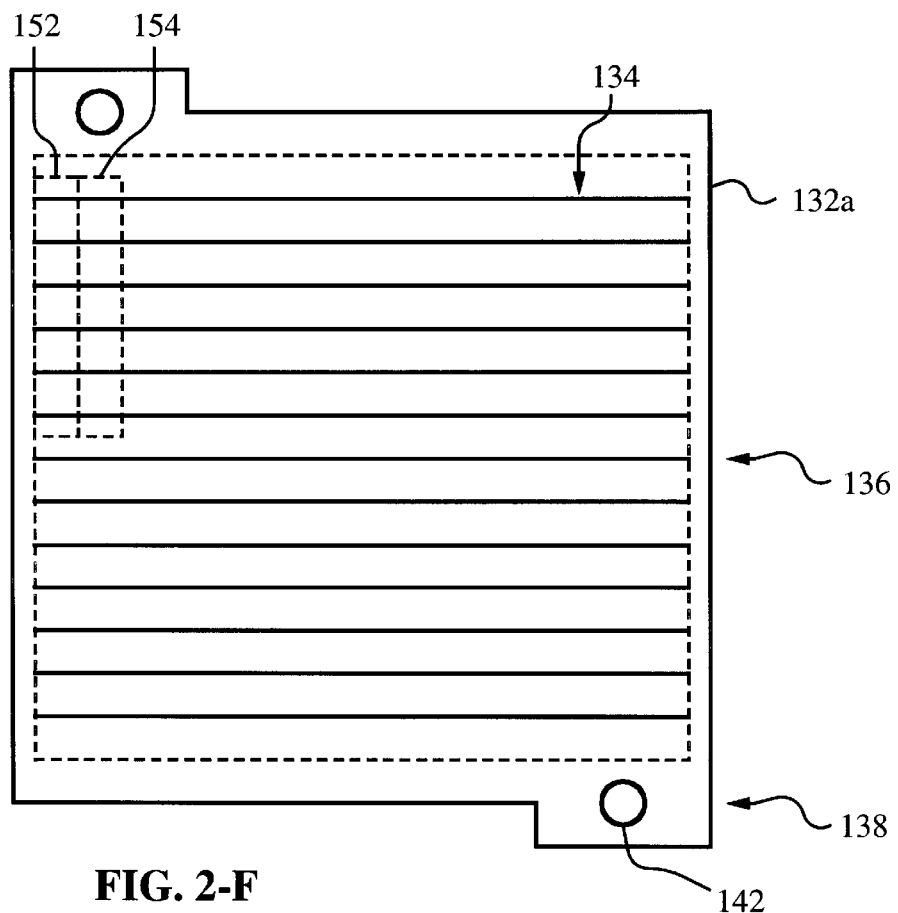
FIG. 2-F
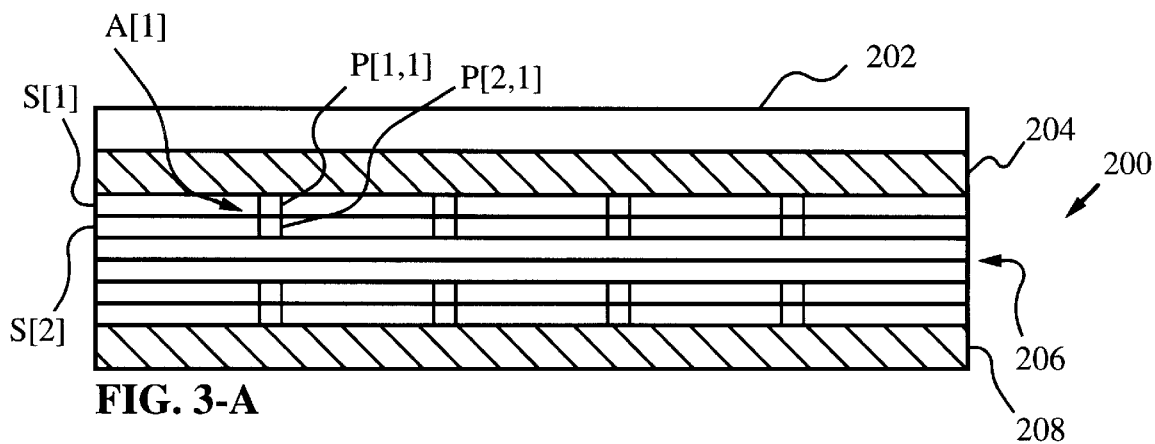
FIG. 3-A

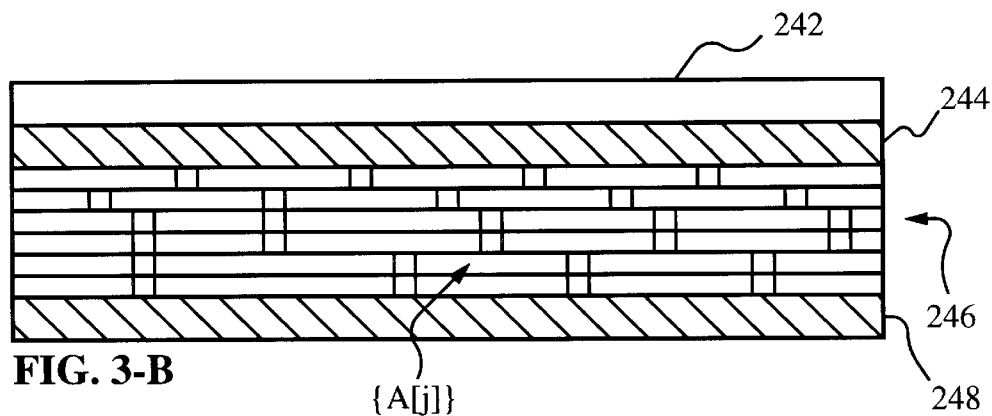
FIG. 3-B
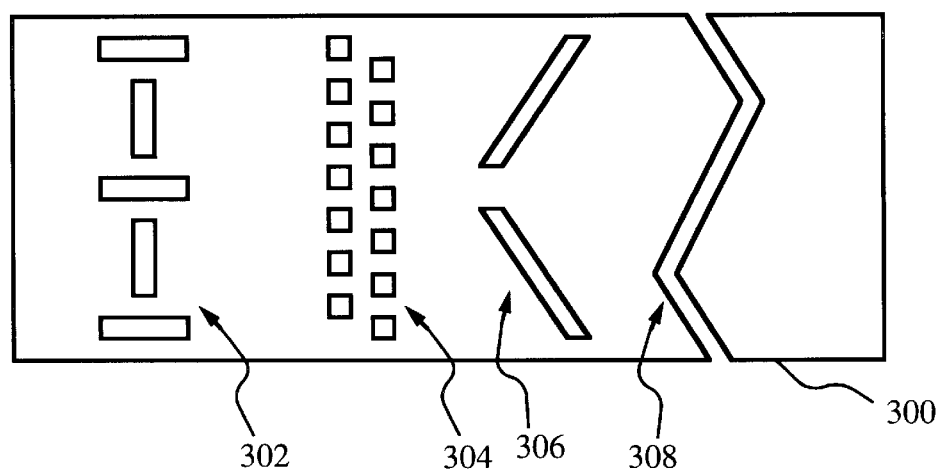
FIG. 4
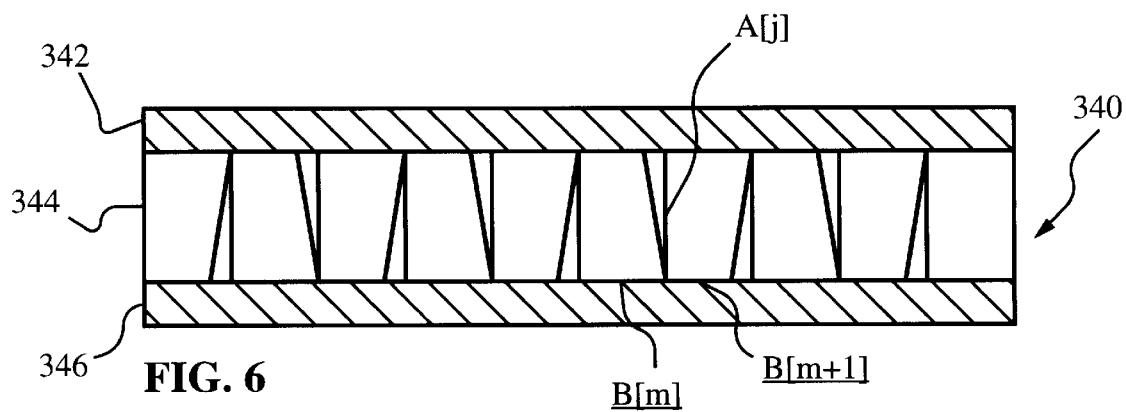
FIG. 6

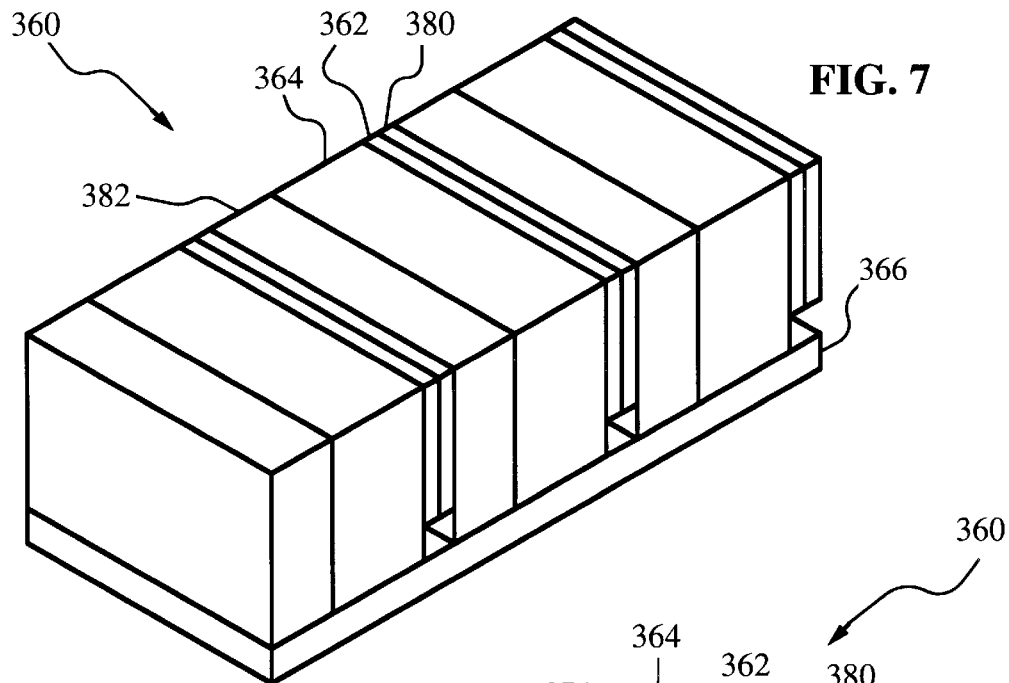
FIG. 7
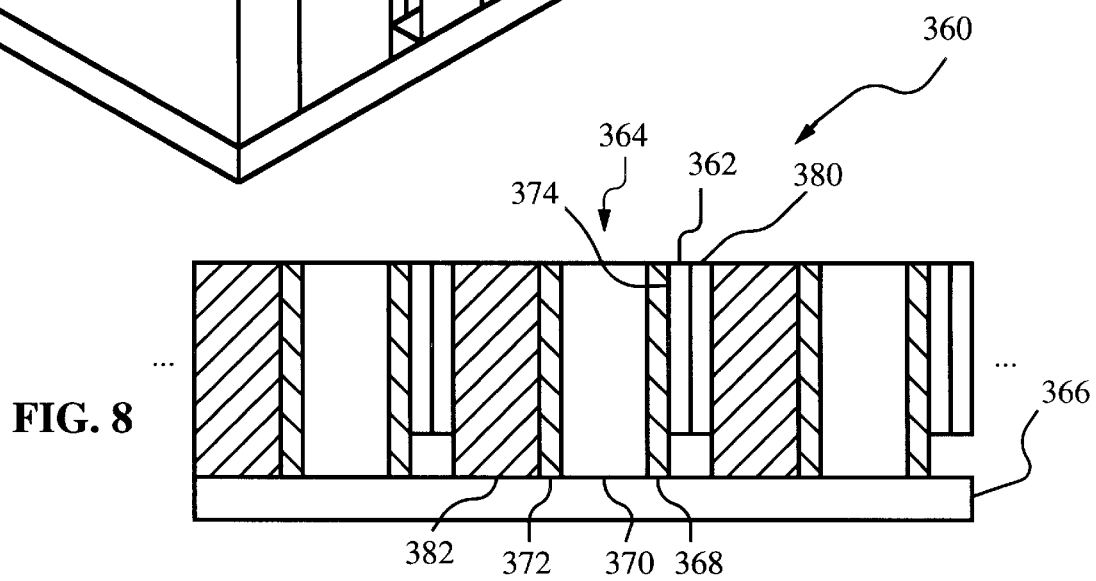
FIG. 8
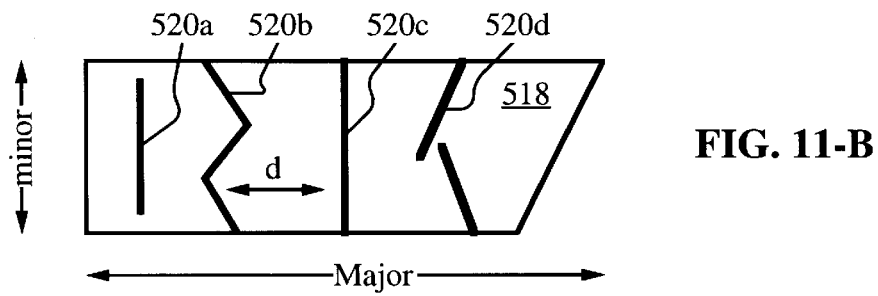
FIG. 11-B

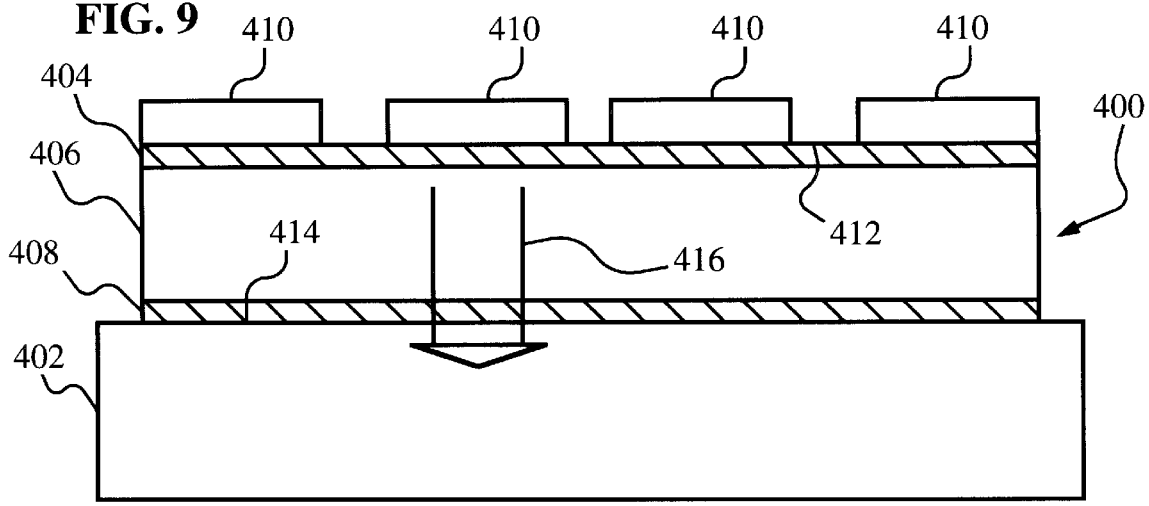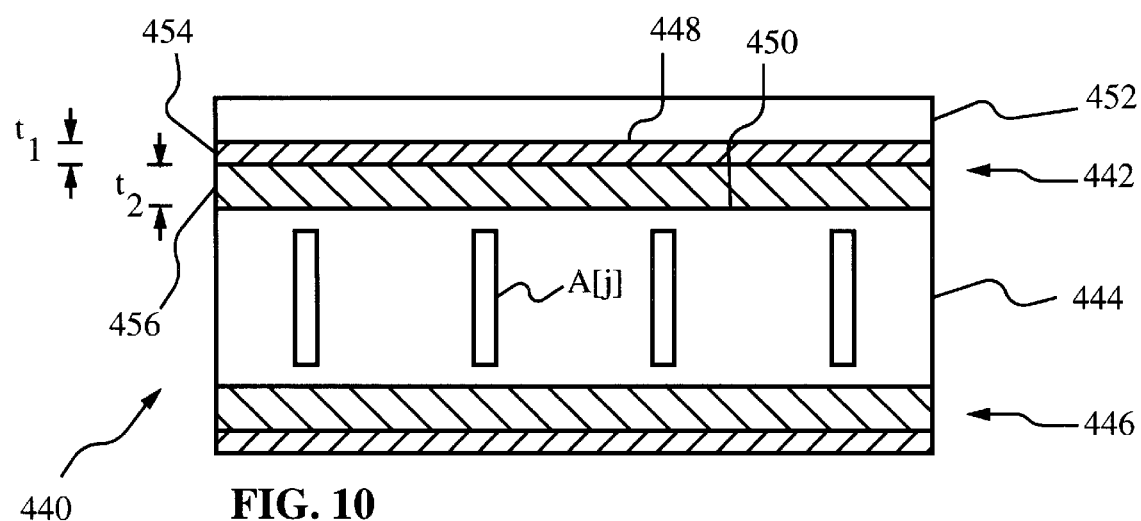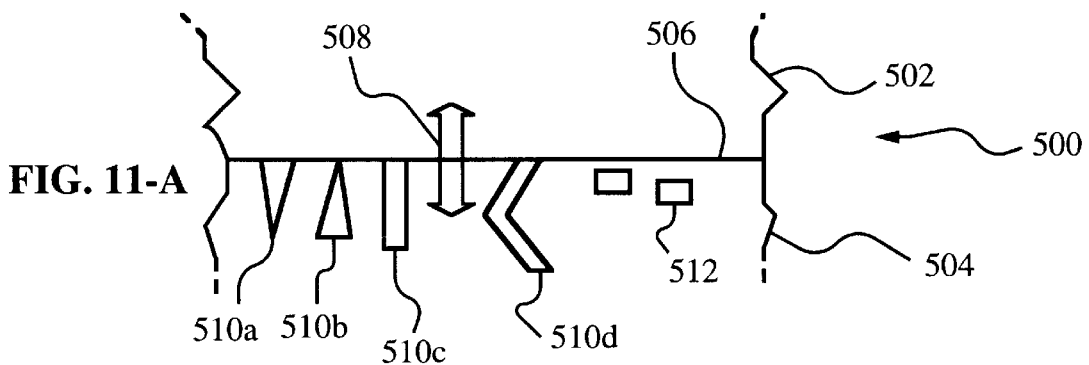

EXPANSION-MATCHED HIGH-THERMAL-CONDUCTIVITY STRESS-RELIEVED MOUNTING MODULES

This invention was made with Government support under Contract No. MDA972-94-3-0020, awarded by ARPA. The Government has certain rights in this invention.

RELATED APPLICATION DATA

This application is related to co-pending U.S. Patent application "No Wire Bond Plate (NWBP) Packaging Architecture for Two Dimensional Stacked Diode Laser Arrays," which is assigned to the assignee of the present invention, and is herein incorporated by reference.

FIELD OF THE INVENTION

This invention relates to high-thermal-conductivity mounting modules that are thermal-expansion-matched to heat-dissipating electronic components (elements) mounted on the modules, and are simultaneously subject to minimal thermal stresses. More particularly, it relates to thermal-expansion-matched, high-thermal-conductivity, stress-relieved mounting modules for diode laser arrays.

BACKGROUND OF THE INVENTION

Many electronic high-power elements dissipate large amounts of heat over a small spatial extent, and are simultaneously subject to stringent constraints on operating temperature. Such heat-dissipating elements may include, but are not limited to, individual diode lasers, edge-emitting and surface-emitting diode laser arrays, light-emitting-diodes (LEDs), thyristors, and high-power field-effect transistors (FETs). Efficient cooling of such elements is vital to their normal operation.

In a commonly used cooling design approach, the heat-dissipating elements are brought in thermal contact with a heat sink through corresponding heat-conductive submounts (mounting modules). For given heat sink and device temperatures, the heat flow through a submount depends on the submount geometry and on the thermal properties of the submount materials. High-thermal-conductivity materials such as Cu are thus desirable for use in submounts.

Such high-thermal-conductivity materials may not be, in general, thermal-expansion-matched to the elements mounted on the submounts. Differences in thermal expansion coefficients between a submount and its corresponding element lead to deleterious stresses in the element upon heating or cooling of the element-submount complex. An element and its corresponding submount may need to be heated to temperatures on the order of hundreds of °C. during the assembly (e.g. soldering) of the complex. Subsequent cooling of the complex to room temperature could lead to unacceptable stresses in the element. Moreover, normal operation of the element may lead to variations in its temperature. For light-emitting elements, variations in temperature may also lead to misalignment with external optical components such as lenslet arrays.

Thermal stresses can be minimized by mounting the elements on expansion-matched submounts. Materials that are expansion-matched to a given type of element, or element material, may not be in general very good thermal conductors, however. No submounts are currently available that combine the cooling advantages of good thermal conductors with the stress-reducing advantages of expansion-matched materials.

Useful high-power heat-dissipating elements include diode lasers, and particularly monolithic edge-emitting linear diode laser arrays (laser bars). A typical laser bar emits on the order of tens of W of heat in a very small volume, and requires operating temperatures not higher than room temperature. Typical bars are also very sensitive to stresses. Various designs for diode laser submounts are discussed in a number of U. S. Patents. For more information on conventional designs for diode laser submounts, see for example U. S. Pat. Nos. 4,716,568, 5,099,488, or 5,107,091, which are herein incorporated by reference. For a description of a mounting arrangement for semiconductor chips, see for example U.S. Pat. No. 4,383,270.

The submounts disclosed in U.S. Pat. No. 5,107,091 are attached to a base plate comprising microchannels for cooling fluid. The fluid cooling of the base plate improves the heat-transfer capability of the submounts by lowering the temperature of the submount bases, but does not improve the thermal conductivity of the submounts. Moreover, fluid cooling significantly increases the complexity of the arrays.

U.S. Pat. No. 5,105,430 describes a fluid-cooled submount comprising a silicon wafer having microchannels for cooling fluid. While silicon submounts are quasi-expansion-matched to typical (GaAs) diode laser bars, and are relatively easy to etch, they have poor thermal conductivities and require very efficient fluid cooling for operation.

An expansion-matched CuMoCu clad composite for GaAs electronic components is commercially available from Climax Metals (OH). The composite comprises a thick Mo layer sandwiched between two thin Cu plates. The thicknesses of the Cu and Mo layers are chosen such that the submount is expansion-matched to GaAs at a mounting surface of the submount. The submount does not provide very efficient cooling since its bulk is made of Mo, a relatively poor thermal conductor.

OBJECTS AND ADVANTAGES OF THE INVENTION

Accordingly, it is a primary object of the present invention to provide a device comprising an improved mounting module for a high-power heat-dissipating electronic element. It is another object of this invention to provide a mounting module for a diode laser or diode laser array. It is an additional object of this invention to provide a mounting module which has a high thermal conductivity and is expansion-matched to its corresponding heat-dissipating element. It is another object of this invention to provide a module comprising a stress-relieved high-thermal-conductivity bulk layer brazed to an expansion-matched mounting plate. It is a further object of this invention to provide a bulk layer having stress-relief apertures, wherein the apertures allow expansion of the bulk layer within the apertures and along the mounting plate. It is yet another object of this invention to provide a bulk layer having stress-relief apertures that do not significantly impede heat flow through the module. It is still another object of this invention to provide a bulk layer having stress-relief apertures significantly deeper (dimension transverse to the mounting surface) than a minor size of the apertures along the mounting surface.

SUMMARY OF THE INVENTION

These objects and advantages are attained by a heat dissipating device comprising at least one heat-dissipating element mounted on a high-thermal-conductivity, expansion-matched, stress-relieved mounting module. The mounting module comprises a thermally conductive mounting plate and a thermally conductive, stress-relieved bulk layer. The heat-dissipating element is mounted on a mounting surface of the mounting plate. The mounting plate further comprises a heat transfer surface opposite the mounting surface. The bulk layer is attached to the heat transfer surface, and has a set of stress relief apertures {A[j]} for accommodating an expansion of the bulk layer along the heat transfer surface.

Preferably, the module is thermal-expansion-matched to the heat-dissipating element. That is, a thermal expansion coefficient of the module is substantially equal to a thermal expansion coefficient of the heat-dissipating element, such that mechanical stresses in the element during its operation do not substantially degrade its performance or lifetime. At least the mounting plate is thermal-expansion-matched to the element, i.e. a thermal expansion coefficient of the mounting plate is substantially equal to a thermal expansion coefficient of the element, such that the element is not subject to substantial lifetime- or performance-degrading stresses during its operation.

Expansion-matching the mounting plate to the element, together with stress-relieving the bulk layer, allow the use of a bulk layer with a higher thermal conductivity than that of the mounting plate, even if the predominant material of the bulk layer is not expansion-matched to the element. In particular, the stress relief apertures allow the use of a bulk layer having a thermal expansion coefficient higher than a thermal expansion coefficient of the mounting plate.

At least a portion of an aperture A[j] is adjacent to the heat transfer surface, such that A[j] relieves a stress in the bulk layer, along and adjacent to the heat transfer surface. Aperture A[j] is preferably transverse to the mounting surface, such that A[j] only minimally impedes a heat flow transverse to the mounting surface. That is, a minor surface of A[j] is along the mounting surface. A major surface of A[j] is preferably transverse to the mounting surface.

The bulk layer preferably comprises more than one aperture, i.e. J>1. Since the stress at the bulk layer/mounting plate interface is larger along larger dimensions of the interface, the apertures {A[j]} are preferably spaced apart along a major dimension of the mounting plate.

The mounting module is in thermal communication with a heat sink along a base surface of the module. The heat sink preferably comprises a thermally conductive, electrically insulating base plate having markings for mounting modules. The module is mounted on the base plate along the base surface. Preferably, a minor surface of A[j] is along the base surface such that A[j] only minimally impedes a heat flow transverse to the base surface. Preferably, at least some of the apertures {A[j]} are channels running transverse to the heat transfer surface and to the base surface. Preferably, the channels are substantially perpendicular to the heat transfer surface and to the base surface.

In a preferred embodiment particularly suited for high-power edge-emitting diode laser arrays, the base surface is transverse to the heat transfer surface. The heat-dissipating element comprises a diode laser having an emitting surface transverse to the heat transfer surface. The diode laser is part of a monolithic linear diode laser array (laser bar) mounted on the heat transfer surface.

In another embodiment suited for surface-emitting diode laser arrays, the base surface is opposite the mounting surface. The heat-transfer surface is between the base surface and the mounting surface. The heat-dissipating element comprises an array of diode lasers having emitting surfaces opposite the mounting surface, such that the mounting surface is situated between the emitting surface and the base surface.

High-power arrays require minimum module dimensions determined by the laser size and/or heat flow requirements. Unless the bulk layer is very thin or short (see FIG. 1-B for illustration), it may be impractical to etch or machine the apertures {A[j]} through the whole bulk layer. Thus, the bulk layer is preferably assembled from a plurality of stacked sheets, wherein parts of the apertures {A[j]} are defined in each sheet prior to assembly of the bulk layer. Alternatively, the bulk layer is assembled from a plurality of bonded blocks, wherein the apertures {A[j]} are defined at the interfaces between adjacent blocks.

In a preferred embodiment, the bulk layer comprises a set of sheets {S[n]}, n=1 . . . N, N>1. A sheet S[n] comprises a part P[n,j] of an aperture A[j]. A sheet S[n+1] adjacent to S[n] is stacked onto and bonded to S[n]. The part P[n,j] of S[n] is aligned with a part P[n+1,j] of S[n+1]. It is preferred that, for a fixed j and varying n, an aperture A[j] be defined by the parts {P[n,j]}.

Since a high-thermal conductivity bond between the sheets (S[n]) is desirable, and since stress-relieving the bulk layer allows high-temperature processing steps, the sheets {S[n]} are preferably brazed together. The module comprises a brazing material between S[n] and S[n+1], for bonding S[n] to S[n+1].

The orientation of the sheets {S[n]} with respect to the mounting surface is chosen according to the dimensions of the bulk layer. The maximum sheet thickness is constrained by the dimensions of parts {P[n,j]}, and by the process (etching, machining, etc.) used to define the aperture parts. In general, for a given sheet thickness, the bulk layer is more easily assembled from a smaller number of sheets. If the dimensions of the bulk layer along the mounting surface are larger than the dimension of the bulk layer transverse to the mounting surface, a major surface of S[n] is preferably along the mounting surface. Preferably, a major surface of S[n] is substantially parallel to the mounting surface. In another embodiment, the bulk layer comprises a set of blocks {B[m]}, m=1 . . . M, M>1. An aperture A[j] is defined by a block B[m] and a block B[m+1] adjacent to B[m].

Since efficient heat transfer from the heat-dissipating element and through the mounting module is desirable, the mounting surface and the heat transfer surface are preferably major surfaces of the mounting plate.

If the thermal expansion coefficient of the bulk layer is substantially different from that of the mounting plate, variations in module temperature would lead to the curling of a module consisting only of a bulk layer and a thin mounting plate. An auxiliary plate is attached to the bulk layer opposite the mounting plate, such that the bulk layer is situated between the mounting plate and the auxiliary plate. The auxiliary plate provides mechanical stability to the module by balancing the force on the bulk layer generated by the mounting plate. The auxiliary plate allows the use of a relatively thin mounting plate. A thin plate is particularly desirable if its thermal conductivity is lower than that of the bulk layer.

Thermal-expansion-matching a mounting module to a diode laser, in addition to extending the lifetime of the laser, reduces variations with temperature in the direction of its light emission. Control over the direction laser emission is vital in systems comprising lenses aligned with the lasers.

As explained in more detail in the above-incorporated co-pending application "No Wire Bond Plate (NWBP) Packaging Architecture for Two Dimensional Stacked Diode Laser Arrays," an electrically conductive cap is mounted on a diode laser opposite the mounting plate, i.e. such that the laser is situated between the mounting plate and the cap. An electrical connection is established between the mounting surface and the cap through the laser. The cap mounted on the laser is also bonded to an auxiliary plate corresponding to an adjacent laser, and provides an electrical communication between the first laser and the auxiliary plate of the adjacent laser. The caps eliminate the need for the wire bond plates conventionally used as contacts for the edge-emitting lasers, and thus allow shortening the mounting modules.

An expansion-matched mounting module of the present invention is suitable for use with a variety of high-power heat-dissipating elements, including light-emitting-diodes (LEDs), master oscillator-power amplifiers (MOPAs), thyristors, and field effect transistors (FETs).

In one embodiment, a fluid inlet and a fluid outlet are in communication with the apertures $\{A[j]\}$, and allow the flow of a cooling fluid from the inlet, through the apertures $\{A[j]\}$, and to the outlet.

In an embodiment in which the heat-dissipating element is made of GaAs, the mounting plate is preferably made of a Cu—W composition that is substantially thermal-expansion-matched to GaAs. Such compositions are well known in the art. The bulk layer comprises a fraction of Cu higher than 90%.

Efficient heat dissipation is particularly important in arrays of densely-packed heat-dissipating elements. A device of the present invention preferably comprises a base plate, a plurality of mounting modules periodically spaced and mounted on the base plate, and a plurality of heat-dissipating elements, wherein at least one of the heat-dissipating elements is mounted on one of the modules.

Applications of high-power diode laser arrays of the present invention include optical communication and printing systems. An optical communication system comprises a heat-dissipating light source mounted on a module of the present invention, a modulator for controlling an output of the light source and for encoding a datum in the output, an optical link (e.g. optical fiber) in optical communication with the modulator, for transmitting the datum, and a data readout means in optical communication with the optical link, for reading the datum following its transmission through the optical link. A printing system comprises a heat-dissipating light source mounted on a module of the present invention, and an imaging system in optical communication with the light source. The output of the light source is optically coupled to the input of the imaging system.

In general, a stress-relieved thermal conduction device of the present invention comprises two bonded pieces having different thermal expansion coefficients. At least one of the pieces (preferably the faster-expanding piece) has stress-relief apertures for accommodating its expansion along the contact surface between the two pieces. The apertures preferably comprise channels running transverse to the contact surface. The apertures are spaced apart along a major dimension of the contact surface. The distance between the apertures along the major dimension is preferably equal to a minor dimension of the contact surface. More generally, if the apertures relieve stress along both dimensions, it is preferred that the aperture spacings be substantially equal along the two dimensions, such that the stresses along the contact surface are substantially equal along the contact surface.

DESCRIPTION OF THE FIGURES

FIG. 1-A is a perspective view of a two-dimensional edge-emitting diode laser array.

FIG. 1-B is a side view of part of the array of FIG. 1-A, including a mounting module of the present invention.

FIG. 2-A is an exploded view of a stress-relieved mounting module comprising stacked sheets, according to a preferred embodiment of the present invention FIG. 2-B is a top view of the module of FIG. 2-A.

FIG. 2-C is a front view of a sheet of the module of FIG. 2-B.

FIG. 2-D is a side view of the module of FIG. 2-B.

FIG. 2-E is an exploded view of a stacked assembly of primary sheets used to manufacture modules of the present invention.

FIG. 2-F is a sectional view through the assembly of FIG. 2-E.

FIG. 3-A is a top view of a module in which stress-relief apertures extend only partially through the bulk layer, according to the present invention.

FIG. 3-B illustrates alternative alignments of apertures between sheets, according to the present invention.

FIG. 4 illustrates various aperture cross-sections, according to the present invention.

FIG. 5 shows a module having sheets stacked along the heat transfer surface of the mounting plate, according to the present invention.

FIG. 6 is a top view of module having a bulk layer comprising blocks, wherein stress-relief apertures are defined at the interfaces between adjacent block, according to the present invention.

FIG. 7 is a perspective view of part of a No Wire Bond Plate (NWBP) two-dimensional edge-emitting diode laser array, according to a preferred embodiment of the present invention.

FIG. 8 is a side view of the array of FIG. 7.

FIG. 9 is a sectional view of a mounting module having opposite mounting and base surfaces, according to the present invention.

FIG. 10 is a top view of a module having a mounting plate comprising multiple layers, according to the present invention.

FIG. 11-A is a sectional view of a stress-relieved thermal conduction device of the present invention.

FIG. 11-B is a view of the contact surface between two pieces of the device of FIG. 11-A.

DETAILED DESCRIPTION

In the following discussion, for some element X, the notation X[k] is understood to correspond to some (fixed) integer k between 1 and a maximum value K, while the notation $\{X[k]\}$ is understood to refer to a set of X[k] for varying values of k. The notation $\{X[k,m]\}$ is understood to refer to a set of X[k,m], wherein at least one of the indexes k and m varies. A set is understood to contain one or more elements. The term "laser" is understood to encompass individual laser emitters and laser arrays, including monolithic laser arrays.

FIG. 1-A is a perspective view of part of a heat-dissipating device of the present invention, a two-dimensional edge-emitting diode laser array 20. Array 20 comprises a laser bar 30 having an emitting surface 32. Bar 30 is made substantially of GaAs. Bar 30 is capable of emitting monochromatic light through parts of emitting surface 32, as indicated by the vertical arrows in FIG. 1-A.

Bar 30 is mounted on a mounting module 34, which in turn is mounted on a base plate 36. Module 34 is mounted on base plate 36 along a base surface 62 of module 34, as shown in FIG. 1-B. Base plate 36 is made of a thermally conductive and electrically insulating material such as BeO. Base plate 36 is in thermal communication with a heat sink (not shown). Ways of removing heat from base plate 36 are well known in the art. A wire bond plate 38 supports wires 40 in electrical communication with bar 30, as shown in FIG. 1-B. For further details on two-dimensional laser arrays similar to that shown in FIG. 1-A, see for example the above-incorporated U.S. Pat. No. 4,716,568.

FIG. 1-B is a side view of part of the array of FIG. 1-A. Module 34 has a thickness t, a height h (as shown), and a length L (perpendicular to the page, not shown). Since bar 30 dissipates a large amount of heat, it is important that module 34 conduct heat effectively from bar 30 to base plate 36, so as to maintain the temperature of bar 30 below a predetermined threshold. The heat flow from bar 30 to base plate 36 is represented schematically by arrow 44. The heat flow depends on the thermal conductivity of the materials of module 34, and on the geometry of module 34. In particular, in the configuration of FIG. 1-B, the heat flow increases with larger t and smaller h.

Module 34 comprises a thermally conductive mounting plate 50, a high-thermal-conductivity bulk layer 52, and an auxiliary plate 54 identical to mounting plate 50 and bonded to bulk layer 52. Mounting plate 50 has a mounting surface 58, and a heat transfer surface 60 opposite mounting surface 58. Mounting surface 58 is transverse to emitting surface 32; in particular, as illustrated in FIG. 1-B, mounting surface 58 is substantially orthogonal to emitting surface 32. A lens 64, shown schematically in FIG. 1-B, is aligned with bar 30 and collects a laser beam 65 emitted by bar 30. Lens 64 can be optically coupled to the input of an imaging system (not shown), or to an optical link (not shown). An expansion-matched, stress-relieved module of the present invention allows maintaining the alignment between bar 30 and lens 64, even as the temperatures of bar 30 and module 34 vary.

Mounting plate 50 is expansion-matched to bar 30. In particular, mounting plate 50 is preferably made of a CuW composition that is expansion-matched to GaAs; such a composition is well known in the art. Bulk layer 52 has a higher thermal conductivity than mounting plate 50, and is preferably made of a high-thermal-conductivity material such as Cu.

Auxiliary plate 54 is attached to bulk layer 52 opposite mounting plate 50, such that bulk layer 52 is situated between mounting plate 50 and auxiliary plate 54. If mounting plate 50 and bulk layer 52 have different thermal expansion coefficients, heating module 34 results in a stress at the interface between mounting plate 50 and bulk layer 52. If unbalanced, the stress tends to curl the shape of module 34. Auxiliary plate 54 provides mechanical support to module 34 by balancing the force on bulk layer 52 exerted by mounting plate 50, thus allowing the use of a relatively thin mounting plate 50.

Module 34 is assembled before the mounting of bar 30. The assembly of module 34 typically includes a heating step for melting a bonding material. The bonding material creates bonds between bulk layer 52 and mounting plate 50. The maximum temperature allowable in the heating step may be limited by the thermal stresses which develop at the bulk layer-mounting plate interface upon cooling of module 34 to operating (room) temperature, if bulk layer 52 and mounting plate 50 are not expansion matched. Large stresses may significantly alter the thermal expansion coefficient of mounting plate 52.

FIG. 2-A is a perspective exploded view of a module 100, according to a preferred embodiment of the present invention. A heat-dissipating element 102 is mounted on module 100. Module 100 comprises a thermally conductive mounting plate 104, a bulk layer 106 bonded to plate 104, and an auxiliary plate 108 identical to mounting plate 104 and bonded to bulk layer 106. Bulk layer 106 has a set of stress-relief apertures $\{A[j]\}$, j=1 . . . J, for accommodating an expansion of bulk layer 106 along heat transfer surface 112. Typical methods of defining apertures in an isotropic material (such as a metal) cannot define apertures that are much deeper than the aperture cross-section. Thus bulk layer 106 is preferably assembled from a set of bonded, thermally conductive, stacked sheets $\{S[n]\}$, n=1 . . . N, N>1. A sheet S[n] comprises a set of sheet sections $\{S'[n,j]\}$, j=1 . . . J+1.

FIG. 2-B is a top view of module 100. Module 100 has a length L, a thickness t (as shown), and a height h (not shown, perpendicular to the page). Mounting plate 104 has a mounting surface 110 and a heat transfer surface 112. Since the heat flow through mounting surface 110 and heat transfer surface 112 increases with their areas, it is preferred that mounting surface 110 and heat transfer surface 112 are major surfaces of mounting plate 104.

The expansion of bulk layer 106 along heat transfer surface 112 is indicated schematically by the horizontal arrows in FIG. 2-B. The apertures $\{A[j]\}$ are spaced apart along a major dimension of mounting plate 104. In the module shown in FIG. 2-B, the length L is much larger that the height h, and therefore stress relief along L is more useful than stress-relief along h. Apertures $\{A[j]\}$ are thus spaced along the length of bulk layer 106. Clearly, the geometry and spacing of apertures $\{A[j]\}$ depend in general on the dimensions of module 100.

The bulk of module 100 consists of the high-thermal-conductivity bulk layer 106. If bulk layer 106 has a different expansion coefficient than element 102, it is important that the expansions of bulk layer 106 and mounting plate 104 be decoupled. The stress-relief apertures $\{A[j]\}$ serve primarily to decouple the expansions of the bulk layer and mounting plate, by providing room for the faster-expanding bulk layer 106. The stress-relief apertures $\{A[j]\}$ allow the use of a bulk layer 106 having a different expansion coefficient than mounting plate 104. Materials with very high thermal conductivities thus become available for use in bulk layer 106 since the choice of materials for bulk layer 106 is not severely limited by the materials' thermal expansion coefficients.

In a preferred embodiment, apertures $\{A[j]\}$ serve as reservoirs for excess bonding material during the bonding of mounting plate 104 and auxiliary plate 108 to bulk layer 106, thus allowing a relaxation of the tolerances in the thicknesses of bulk layer 106, mounting plate 104, and auxiliary plate 108.

In an alternative embodiment, apertures $\{A[j]\}$ serve as conduits for cooling fluid. As is apparent to the skilled artisan, there are many ways to direct a fluid flow through a module of the present invention. For a description of fluid flow in a diode laser array having a fluid-cooled base plate, see for example U.S. Pat. No. 5,107,091, herein incorporated by reference. A fluid inlet and a fluid outlet in communication with apertures $\{A[j]\}$ are provided. For example, the fluid inlet is provided in an inlet cap (not shown) bonded on the top side of bulk layer 106, while the fluid outlet is provided in an outlet cap (not shown) on the bottom side of bulk layer 106. Fluid then flows between the inlet cap and the outlet cap through apertures {A[j]}.

Apertures {A[j]} obstruct to some extent the heat flow transverse to heat transfer surface 112. Therefore, it is important that the cumulative cross-sectional area of apertures {A[j]} along heat transfer surface 112 be a small fraction of the total area of heat transfer surface 112. Moreover, it is important that the cumulative cross-sectional area of apertures {A[j]} along the base surface of module 100 be a small fraction of the total area of the base surface, so that apertures {A[j]} do not significantly obstruct the flow of heat transverse to the base surface.

The number and spacings of apertures {A[j]} are limited on one hand by the requirement that the apertures relieve stress effectively, and on the other by the requirement that bulk layer 106 conduct heat efficiently. A small number of distantly spaced apertures may not relieve stress effectively, while a large number of closely spaced apertures may hinder heat flow through bulk layer 106. In addition, the spacings L' between apertures {A[j]} are related to the thickness and stiffness of mounting plate 104, and to the difference in the thermal expansion coefficients of mounting plate 104 and bulk layer 106: larger spacings L' require a thicker mounting plate 106 for mechanical support.

It is not useful to space apertures {A[j]} along the length L of bulk layer 106 much closer than its height h, since the stress along h becomes dominant in a module having apertures {A[j]} very closely spaced along L. Thus, L' is on the same order of magnitude as (and preferably equal to) h. In a module having comparable h and L values; it is useful to provide apertures that provide stress-relief both along h and L.

FIG. 2-C is a front view of a sheet S[n]. Sheet S[n] comprises a part P[n,j] of an aperture A[j]. Part P[n,j] is substantially aligned to a part P[n+1,j] of a sheet S[n+1], at least for some n, and preferably for all n<N−1. For a fixed j and varying n, the parts {P[n,j]} define aperture A[j]. Part P[n,j] is defined at the interface between adjacent sheet sections S'[n,j] and S'[n,j+1]

FIG. 2-D is a side view of module 100. Sheet S[n+1] is stacked onto and bonded to sheet S[n]. In general, the choice of stacking direction for sheets {S[n]} depends on the dimensions of bulk layer 106, and on the thermal resistance at the interface between adjacent sheets. In a preferred embodiment, the dimensions of bulk layer 106 along heat transfer surface 112 (related to h and L, the height and length of module 100) are larger than its dimension transverse to heat transfer surface 112 (related to t, the thickness of module 100). Since it is desirable to assemble bulk layer 106 from a minimal number of sheets, sheets {S[n]} are stacked along a direction transverse to heat transfer surface 112. A major surface of S[n] is along, and preferably parallel to, heat transfer surface 112.

The presence of stress-relief apertures allows brazing bulk layer 106 to mounting plate 104. The copper bulk layer 106 is attached to the CuW mounting plate 104 by CuAg brazing at 800° C. Brazing creates very high thermal conductivity bonds, but requires heating module 100 to higher temperatures than those used in soldering. In the absence of stress-relief, brazing would lead to significantly higher stresses than soldering at the interface between mounting plate 104 and bulk layer 106, upon cooling of module 100 to operating (room) temperature following its assembly. Such stresses would, in turn, alter the thermal expansion coefficient of the mounting plate. Such stresses are significantly reduced, however, in a stress-relieved module of the present invention.

Preferably, sheets {S[n]} are brazed together. That is, module 100 further comprises a brazing material between S[n] and S[n+1], for bonding S[n] and S[n+1]. Brazing sheets {S[n]} together is particularly important if the interfaces between adjacent sheets are transverse to the heat flow through module 100, as in the arrangement of FIG. 2-B. If the thermal resistance at the interface between adjacent sheets is low, stacking sheets {S[n]} along a direction transverse to heat transfer surface 112 does not lead to a significantly increased thermal resistance transverse to heat transfer surface 112.

FIG. 2-E is an exploded view of a stacked assembly 130 used to produce a large number of mounting modules of the present invention. Channels 134 are etched in a number of primary sheets 132*a*–*e*. Primary sheets 132*a*–*e* are coated with a thin layer of brazing material and are stacked together. The layer of brazing material is thin enough so that the melted brazing material does not fill channels 134. In conventional brazing, intermediary sheets of brazing material would be introduced between sheets 132*a*–*e*; a large quantity of brazing material between sheets 132*a*–*e* would result in the filling of channels 134 upon the heating of assembly 130, however. It is important, therefore, that sheets 132*a*–*e* be coated with a thin layer of brazing material if channels 134 are relatively narrow.

Frames 144 and 146 laterally enclose a mounting plate 148 and an auxiliary plate 150, respectively Mounting plate 148 and auxiliary plate 150 are stacked onto sheets 132*a*–*e*. FIG. 2-F is a sectional view through assembly 130, passing through sheet 132*a*. Sheet 132*a* has a channel section 136 and a frame section 138. Frame section 138 has a screw hole 142 running through the thickness of sheet 132*a*. After stacking, assembly 130 is heated to a brazing temperature. The brazing material melts and forms high-thermal-conductivity bonds between adjacent primary sheets 132*a*–*e*, and between sheets 132*a*, 132*e* and plates 148, 150, respectively.

After the brazing step, assembly 130 is lapped to a predetermined thickness, so as to compensate for tolerances in the thicknesses of sheets 132*a*–*e* and plates 148, 150. Following the lapping step, mounting modules 152, 154 are cut from assembly 130, as shown in FIG. 2-F. It is important that the edges along which module 152 is cut be sharp, so that a heat-dissipating element can be mounted flat on module 152. Therefore, module 152 is preferably cut by electron discharge machining (EDM), a technique which does not deposit residue from the cutting process onto the edges of module 152. Electron discharge machining is known in the art.

FIG. 3-A is a top view of an alternative embodiment of the present invention, comprising a module 200 and a heat-dissipating element 202 mounted on module 200. Module 200 comprises a mounting plate 204, a bulk layer 206, and an auxiliary plate 208. Bulk layer 206 comprises a set of apertures {A[j]} including an aperture A[1], and a set of stacked sheets {S[n]} including sheets S[1] and S[2]. Aperture A[1] extends only partially through bulk layer 206, and is defined by a part P[1,1] outlined in S[1], and a part P[2,1] outlined in S[2].

FIG. 3-B illustrates aperture parts {P[n,j]} that are not necessarily aligned between adjacent sheets. A heat-dissipating element 242 is mounted on a module 240. Module 240 comprises a mounting plate 244, a bulk layer 246, and an auxiliary plate 248. Mounting plate 244 has a heat transfer surface 250.

Bulk layer 206 comprises a set of apertures {A[j]}, and a set of stacked sheets {S[n]}. The misaligned aperture parts of FIG. 315 B have similar stress-relieving properties to those of the apertures in FIG. 3-A, but obstruct the heat flow from heat-dissipating element 242 to a larger extent than the apertures in FIG. 3-A.

Various cross-sections of apertures {A[j]} along heat transfer surface 60 are suitable for a module of the present invention, as illustrated in a front view of a bulk layer 300 in FIG. 4.

The choice of aperture geometry depends, among others, on the dimensions of heat transfer surface 60. The apertures 300, 302, 304, and 306 shown in FIG. 4 relieve stress both along the length L and the height h of bulk layer 300. Such aperture shapes are suitable, for example, in a bulk layer wherein both L and h are large enough to require stress relief.

FIG. 5 illustrates an embodiment of the present invention in which sheets {S[n]} are stacked along a direction transverse to the mounting surface. A module 310 comprises a mounting plate 312, a bulk layer 314, and an auxiliary plate 316. A heat-dissipating element 317 is mounted on a mounting surface 319 of mounting plate 312. Mounting plate 312 is attached to bulk layer 314 along a heat transfer surface 319 of mounting plate 312. Bulk layer 314 comprises a sheet S[n] and an adjacent sheet S[n+1] stacked along a direction transverse (in FIG. 5, orthogonal) to heat transfer surface 319. The interface between adjacent sheets is transverse to heat transfer surface 319. The module of FIG. 5 is particularly easy to manufacture if the height of module 310 is its shortest dimension.

As explained above, it may be difficult to define small-cross-section apertures {A[j]} in a single step through the entire thickness of bulk layer 106. Deep apertures could be defined by a laser, but such a process would be very costly. In the preferred embodiment shown in FIG. 2-B, bulk layer 106 is assembled from a plurality of stacked sheets having aperture parts defined prior to the assembly of bulk layer 106. In an alternative embodiment, the bulk layer comprises a plurality of blocks defining apertures {A[j]} at the interfaces between adjacent blocks.

In this alternative embodiment, the bulk layer comprises a set of blocks {B[m]}, m=1 ... M, M>1, as illustrated for M=10 in a top view of a module 340 in FIG. 6. Module 340 comprises a mounting plate 342, a bulk layer 344, and an auxiliary plate 346. Bulk layer 344 comprises a block B[m] and a block B[m+1] adjacent to B[m] (illustrated for m=6). An aperture A[j] (shown for j=6) is defined between blocks B[m] and B[m+1]. Blocks {B[m]} are preferably identical, except possibly for one end block (B[1] or B[M]).

FIG. 7 is a perspective view of a preferred embodiment of the present invention, described in more detail in the above-incorporated co-pending U.S. Patent application entitled "No Wire Bond Plate (NWBP) Packaging Architecture for Two Dimensional Stacked Diode Laser Arrays." A part of a two-dimensional edge-emitting diode laser array 360 comprises a base plate 366, a module 364 mounted on base plate 366, and a laser bar 362 mounted on module 364.

FIG. 8 is a side view of part of the array of FIG. 7. Module 364 comprises a mounting plate 368, a bulk layer 370, an auxiliary plate 372, and a thermally and electrically conductive spacer 382. Mounting plate 368 has a mounting surface 374. An electrically conductive cap 380 is mounted on bar 362 such that bar 362 is situated between mounting surface 374 and cap 380. An electrical connection is established between mounting surface 374 and cap 380 through bar 362. Spacer 382 is attached to auxiliary plate 372 opposite bulk layer 370. Spacer 374 decreases the thermal resistance of module 364. A spacer such as 374 is particularly useful for high-power, high-duty-cycle diode laser arrays, which require very efficient cooling of the lasers.

A mounting module of the present invention is suitable for use with heat-dissipating elements other than edge-emitting diode lasers or laser arrays. Such elements include, and are not limited to, light emitting diodes (LEDs) master oscillator-power amplifiers (MOPAs), thyristors, field-effect transistors (FETs), and surface-emitting diode lasers or laser arrays. Wiring and packaging arrangements for such elements are well known in the art As illustrated in FIG. 9, a base surface of a mounting module of the present invention need not necessarily be transverse to the mounting surface of the module. FIG. 9 shows a mounting module 400 mounted on a base plate 402. Module 400 comprises a mounting plate 404, a bulk layer 406, and an auxiliary plate 408. A plurality of heat-dissipating elements 410 are mounted on a mounting surface 412 of mounting plate 404. Module 400 is mounted on base plate 402 along a base surface 414 of module 400. Base surface 414 is parallel to and opposite mounting surface 412. The heat flow from one of elements 410 is illustrated schematically by the arrow 416.

FIG. 10 shows another embodiment of the present invention. A mounting module 440 comprises a mounting plate 442, a bulk layer 444, and an auxiliary plate 446 identical to mounting plate 442. Mounting plate 442 has a mounting surface 448 and a heat transfer surface 450. A heat-dissipating element 452 is mounted on mounting surface 448. Mounting plate comprises a first layer 454 having a thickness $t_1$, and a second layer 456 having a thickness $t_2$. Layers 454 and 456 have different thermal expansion coefficients, chosen such that one of the coefficients is higher than that of element 452, while the other is lower. The thicknesses of layers 454, 456 are chosen such that mounting plate 442 is expansion-matched to element 452 at mounting surface 448. In a particular implementation of the embodiment shown in FIG. 10, element 452 is a GaAs laser bar, first layer 454 is made of Cu, and second layer 456 is made of Mo. Copper has a higher thermal expansion coefficient than GaAs, while Mo has a lower thermal expansion coefficient than GaAs. Alternatively, second layer 456 is made of a CuW composition expansion-matched to GaAs.

FIG. 11-A is a sectional view of an embodiment illustrating generally the present invention. A thermal conduction device 500 comprises a first piece 502 having a first thermal expansion coefficient, and a second piece 504 having a second thermal expansion coefficient. The thermal expansion coefficients of first piece 502 and second piece 504 are different. In particular, the second thermal expansion coefficient is larger than the first expansion coefficient. Second piece 504 is bonded to first piece 502 along a contact surface 506. Heat flows transverse to contact surface 506, as illustrated by the arrow 508. The heat flow may be from first piece 502 to second piece 504, or from second piece 504 to first piece 502.

Second piece 504 has a plurality of stress relief apertures 510a–d, 512. The actual aperture shapes used in a device such as 500 are chosen according to the application of device 500. It is critical, however, that the apertures relieve stress along contact surface 506 by accommodating an expansion of second piece 504 along contact surface 506. Preferably, the apertures comprise channels running transverse to contact surface 506, as illustrated by channels 510a–d. Other aperture shapes, such as holes 512, are also suitable in a device of the present invention, provided they relieve stress along contact surface 506.

FIG. 11-B is a view of contact surface 506, orthogonal to the view of FIG. 11-A. Contact surface 506 has major and minor dimensions. A plurality of apertures 520a–d are spaced apart along the major dimension, and run along the minor dimension. The distance d between adjacent apertures 520b and 520c, measured along the major dimension, is on the same order of magnitude as (and preferably equal to) the minor dimension of contact surface 506, such that the stresses along the major and minor dimensions of contact surface 506 are substantially equal.

A skilled artisan is aware of suitable design parameters for particular applications of mounting modules of the present invention. The following examples are intended to illustrate orders of magnitude of some design parameters in particular embodiments of the invention, and should not be construed to limit the invention.

Example 1

Consider a GaAs diode laser mounted on a mounting module similar to the one shown in FIG. 2-B. Such a laser requires an operating temperature under 25° C. The mounting module comprises a GaAs-matched CuW mounting plate and a Cu bulk layer. GaAs has a thermal expansion coefficient of ~6.5 ppm/K, which is substantially equal to the expansion coefficient of the CuW composition used for the mounting plate. Copper has a thermal expansion coefficient of ~17.0 ppm/K. Copper is used for the bulk of the mounting module since it has a very high thermal conductivity (~390 W/m K). Tungsten-copper has a lower thermal conductivity than Cu (~200 W/m K).

The spacing between adjacent channels on a sheet is on the order of tens of mils (milliinches), while the width of the channels is on the order of mils. The thicknesses of the Ag brazing layers are on the order of tens of microinches. The GaAs bar and the mounting plate have thicknesses on the order of mils, while the bulk layer has a thickness on the order of tens of mils. The ratio of the spacing between adjacent channels and the mounting plate thickness is on the order of 5:1. The total thickness of an array element (mounting module, laser, and possibly spacer) is on the order of tens of mils.

Example 2

Consider a mounting plate similar to that shown in FIG. 10. Molybdenum has a thermal expansion coefficient of –4.5 ppm/K, which is lower than that of GaAs (–6.5 ppm/K). When a Mo sheet is stacked with a Cu sheet (–17.0 ppm/K), the expansion coefficient of the mounting plate can be made to be nearly 6.5 ppm/K, for appropriately chosen thicknesses of the sheets. Molybdenum does not have a very high thermal conductivity, however, (~140 W/m K), so it is not in general highly desirable as a submount material.

It will be clear to one skilled in the art that the above embodiments may be altered in many ways without departing from the scope of the invention. Many materials are available for use in a submount of the present invention, including high-thermal-conductivity materials such as diamond. For example, diamond or a diamond-metal compound may be suitable for use as part of the mounting plate. High-thermal-conductivity materials other than Cu are suitable for use in the bulk layer. Moreover, is there are many ways of manufacturing a mounting module of the present invention, and in particular there are many available ways of defining stress relief apertures through the bulk layer. Accordingly, the scope of the invention should be determined by the following claims and their legal equivalents.

What is claimed is:

1. A heat-dissipating device comprising a high-thermal-conductivity stress-relieved mounting module, said module comprising:

a) a thermally conductive mounting plate having
      a mounting surface for mounting a heat-dissipating element, and
      a heat transfer surface opposite said mounting surface; and b) a thermally conductive, stress-relieved bulk layer attached to said heat transfer surface, wherein said bulk layer has a set of stress-relief apertures {A[j]} for accommodating an expansion of said bulk layer along said heat transfer surface, j=1 . . . J, J>1.

2. The device of claim 1 wherein a thermal expansion coefficient of said module is substantially equal to a thermal expansion coefficient of said heat-dissipating element.

3. The device of claim 1 wherein a thermal expansion coefficient of said mounting plate is substantially equal to a thermal expansion coefficient of said heat-dissipating element.

4. The device of claim 3 wherein a thermal conductivity of said bulk layer is higher than a thermal conductivity of said mounting plate.

5. The device of claim 3 wherein a thermal expansion coefficient of said bulk layer is higher than said thermal expansion coefficient of said mounting plate.

6. The device of claim 1 wherein at least a portion of an aperture A[j] is adjacent to said heat transfer surface, whereby said aperture A[j] relieves a stress in said bulk layer, adjacent to and along said heat transfer surface.

7. The device of claim 1 wherein a minor surface of an aperture A[j] is along said heat transfer surface, such that said aperture A[j] only minimally impedes a heat flow transverse to said heat transfer surface.

8. The device of claim 7 wherein said set of apertures {A[j]} comprises a set of channels transverse to said heat transfer surface.

9. The device of claim 8 wherein said channels are substantially perpendicular to said heat transfer surface.

10. The device of claim 1 wherein J>1.

11. The device of claim 10 wherein said apertures {A[j]} are spaced apart along a major dimension of said mounting plate.

12. The device of claim 1 wherein said module is in thermal communication with a heat sink along a base surface of said module.

13. The device of claim 12 wherein a minor surface of an aperture A[j] is along said base surface, such that said aperture A[j] only minimally impedes a heat flow transverse to said base surface.

14. The device of claim 12 wherein said heat sink comprises a base plate, said module being mounted on said base plate along said base surface.

15. The device of claim 12 wherein said base surface is transverse to said mounting surface.

16. The device of claim 15 wherein:

a) said heat-dissipating element comprises a diode laser; and b) an emitting surface of said laser is transverse to said mounting surface.

17. The device of claim 16 further comprising a monolithic linear laser array mounted on said mounting surface, said array comprising said diode laser.

18. The device of claim 12 wherein said base surface is opposite said mounting surface.

19. The device of claim 18 wherein:
a) said heat-dissipating element comprises a diode laser; and
b) an emitting surface of said laser is opposite said mounting surface, such that said mounting surface is situated between said emitting surface and said base surface.

20. The device of claim 1 wherein said bulk layer comprises a set of sheets {S[n]}, n=1 ... N, N>1, a sheet S[n] comprising a part P[n,j] of an aperture A[j].

21. The device of claim 20 further comprising a sheet S[n+1] stacked onto and bonded to said sheet S[n].

22. The device of claim 21 wherein said module further comprises a brazing material between said sheet S[n] and said sheet S[n+1], for bonding said sheet S[n] and said sheet S[n+1].

23. The device of claim 21 wherein said part P[n,j] is substantially aligned to a part P[n+1,j] of said sheet S[n+1].

24. The device of claim 20 wherein a major surface of said sheet S[n] is along said heat transfer surface.

25. The device of claim 24 wherein said major surface of said sheet S[n] is substantially parallel to said heat transfer surface.

26. The device of claim 1 wherein said bulk layer comprises a set of blocks {B[m]}, m=1 ... M, M>1.

27. The device of claim 23 wherein an aperture A[j] is defined at an interface between a block B[m] and a block B[m+1] adjacent to said block B[m].

28. The device of claim 1 wherein said mounting surface and said heat transfer surface are major surfaces of said mounting plate.

29. The device of claim 1 wherein said module further comprises an auxiliary plate for providing mechanical stability to said module, wherein said auxiliary plate is attached to said bulk layer opposite said mounting plate, such that said bulk layer is situated between said mounting plate and said auxiliary plate.

30. The device of claim 1 wherein said heat-dissipating element comprises a diode laser.

31. The device of claim 30 wherein said heat-dissipating element comprises a diode laser array.

32. The device of claim 30 wherein an emitting surface of said laser is transverse to said mounting surface.

33. The device of claim 30 further comprising a lens for collecting light emitted by said laser, said lens being aligned with said laser.

34. The device of claim 30 further comprising an electrically conductive cap mounted on said laser, said laser being situated between said mounting plate and said cap, whereby an electrical connection is established between said mounting surface and said cap through said laser.

35. The device of claim 1 wherein said heat-dissipating element comprises an element selected from the group consisting of light-emitting-diodes, master oscillator-power amplifiers, thyristors, and field-effect transistors.

36. The device of claim 1 further comprising a fluid inlet and a fluid outlet in communication with said set {A[j]}, for providing a cooling fluid flow through said set {A[j]}.

37. The device of claim 1 wherein said module further comprises a brazing material between said bulk layer and said mounting plate, for attaching said bulk layer to said heat transfer surface.

38. The device of claim 1 wherein said heat-dissipating element comprises GaAs.

39. The device of claim 38 wherein said mounting plate comprises Cu and W.

40. The device of claim 39 wherein said mounting plate comprises a Cu-W composition that is substantially thermal-expansion-matched to GaAs.

41. The device of claim 39 wherein said bulk layer comprises Cu.

42. The device of claim 41 wherein a fraction of Cu in said bulk layer is higher than 90%.

43. The device of claim 1 further comprising:
a) a base plate;
b) a plurality of mounting modules mounted on said base plate; and
c) a plurality of heat-dissipating elements, wherein at least one of said plurality of heat-dissipating elements is mounted on one of said plurality of mounting modules.

44. The device of claim 43 wherein said plurality of mounting modules are periodically spaced on said base plate.

45. An optical communication system comprising:
a) a heat-dissipating light source;
b) a high-thermal-conductivity stress-relieved mounting module comprising:
a thermally conductive mounting plate having a mounting surface for mounting said heat-dissipating light source, and
a heat transfer surface opposite said mounting surface; and
a thermally conductive, stress-relieved bulk layer attached to said heat transfer surface, wherein said bulk layer has a set of stress-relief apertures {A[j]} for accommodating an expansion of said bulk layer along said heat transfer surface, j=1 ... J, J>1; and
c) a modulator optically coupled to said light source, for encoding a datum in an output of said light source.

46. A printing system comprising:
a) a heat-dissipating light source having an output for printing;
b) a high-thermal-conductivity stress-relieved mounting module comprising:
a thermally conductive mounting plate having
a mounting surface for mounting said heat-dissipating light source, and
a heat transfer surface opposite said mounting surface; and
a thermally conductive, stress-relieved bulk layer attached to said heat transfer surface, wherein said bulk layer has a set of stress-relief apertures {A[j]} for accommodating an expansion of said bulk layer along said heat transfer surface, j=1 ... J, J>1; and
c) an imaging system in optical communication with said light source to receive the output from said light source for input to said imaging system, said imaging system providing for printing of said output.

47. A stress-relieved thermal conduction device comprising:
a) a first piece having a first thermal expansion coefficient; and
b) a second piece bonded to said first piece along a contact surface, wherein
said second piece has a second thermal expansion coefficient different from said first thermal expansion coefficient,
said second piece has a stress-relief aperture adjacent to said contact surface, for accommodating an expansion of said second piece along said contact surface.

48. The device of claim 47 wherein said second thermal expansion coefficient is larger than said first thermal expansion coefficient.

49. The device of claim 47 wherein said aperture comprises a channel running transverse to said contact surface.

50. The device of claim 47 wherein:
   a) said contact surface has a major dimension and a minor dimension;
   b) said second piece has a plurality of stress-relief apertures spaced apart along said major dimension, wherein a distance between adjacent apertures along said major dimension is substantially equal to said minor dimension of said contact surface.

51. A method of cooling a heat-dissipating element, said method comprising the step of establishing a thermal communication between said element and a heat sink, through a high-thermal-conductivity stress-relieved mounting module, said module comprising a thermally conductive mounting plate having
   a mounting surface for mounting a heat-dissipating element, and
   a heat transfer surface opposite said mounting surface; and
a thermally conductive, stress-relieved bulk layer attached to said heat transfer surface, wherein said bulk layer has a set of stress-relief apertures {A[j]} for accommodating an expansion of said bulk layer along said heat transfer surface, j=1 . . . J, J>1.

52. The method of claim 51 wherein said element comprises a diode laser.

* * * * *